United States Patent [19]

Hysell et al.

[11] 4,290,080

[45] Sep. 15, 1981

[54] METHOD OF MAKING A STRAIN BUFFER FOR A SEMICONDUCTOR DEVICE

[75] Inventors: Robert E. Hysell, Berwyn, Pa.; Francis W. Kalkbrenner, Aurora, Ill.

[73] Assignee: General Electric Company, Philadelphia, Pa.

[21] Appl. No.: 77,226

[22] Filed: Sep. 20, 1979

[51] Int. Cl.³ ............................................. H01L 23/34
[52] U.S. Cl. ....................................... 357/81; 357/65; 357/79; 204/192 C; 204/192 EC; 427/91; 427/124; 427/125
[58] Field of Search ........ 204/192 R, 192 C, 192 EC; 427/123, 124, 125, 88, 91; 357/65, 74, 79, 81

[56] References Cited

U.S. PATENT DOCUMENTS

| | | | |
|---|---|---|---|
| 3,128,419 | 4/1964 | Waldkotter | 357/81 |
| 3,273,029 | 9/1966 | Ross | 357/9 |
| 3,295,089 | 12/1966 | Moore | 338/204 |

Primary Examiner—Delbert E. Gantz
Assistant Examiner—William Leader
Attorney, Agent, or Firm—William Freedman; Carl L. Silverman; John P. McMahon

[57] ABSTRACT

A thermally and electrically conductive strain buffer for a semiconductor device is made by a method that comprises the steps of (a) providing a plurality of straight, equal-length strands of copper, with the strands aligned such that their lengths are substantially parallel and their ends define a pair of opposing surfaces and (b) closing packing the strands together. Then, layers of highly conductive metal are deposited on said opposing surfaces, and the deposited metal layers provide sufficient structural integrity to hold the strands together so that the resulting strain buffer can be manipulated with substantially no break-up thereof and with substantially no loss of individual ones of the strands.

24 Claims, 7 Drawing Figures

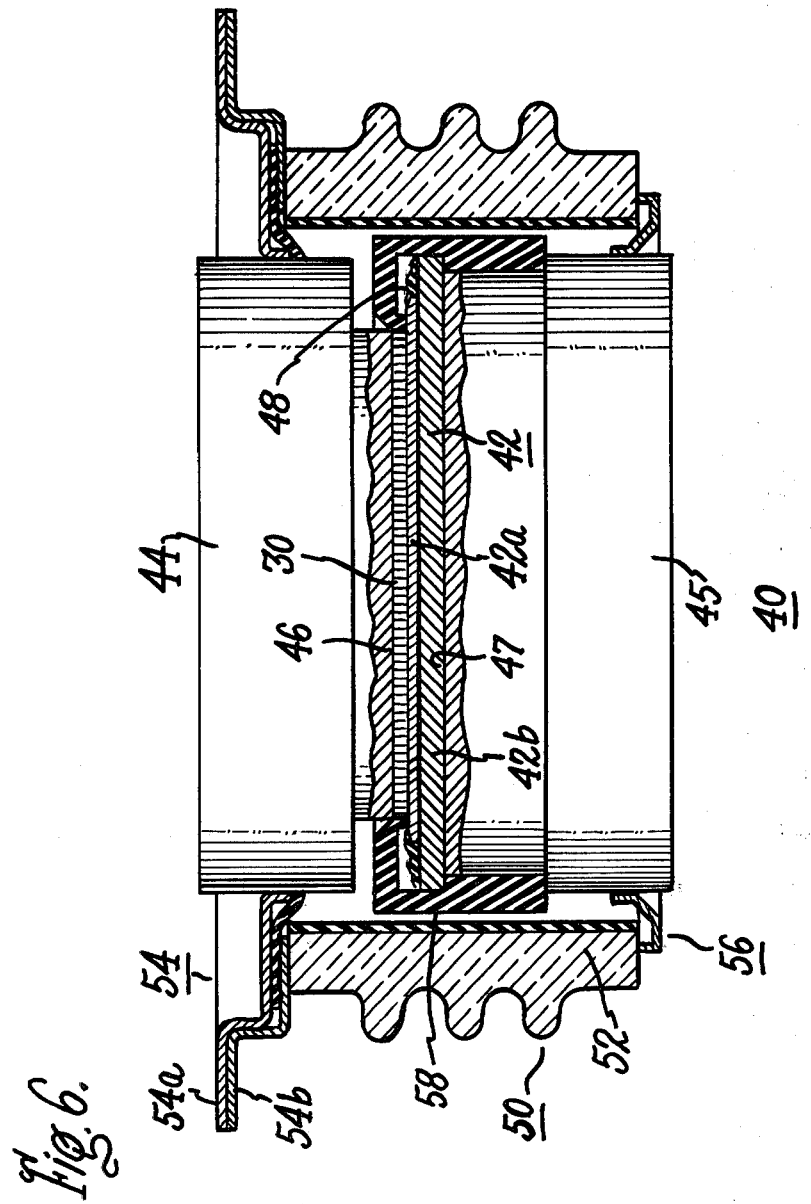

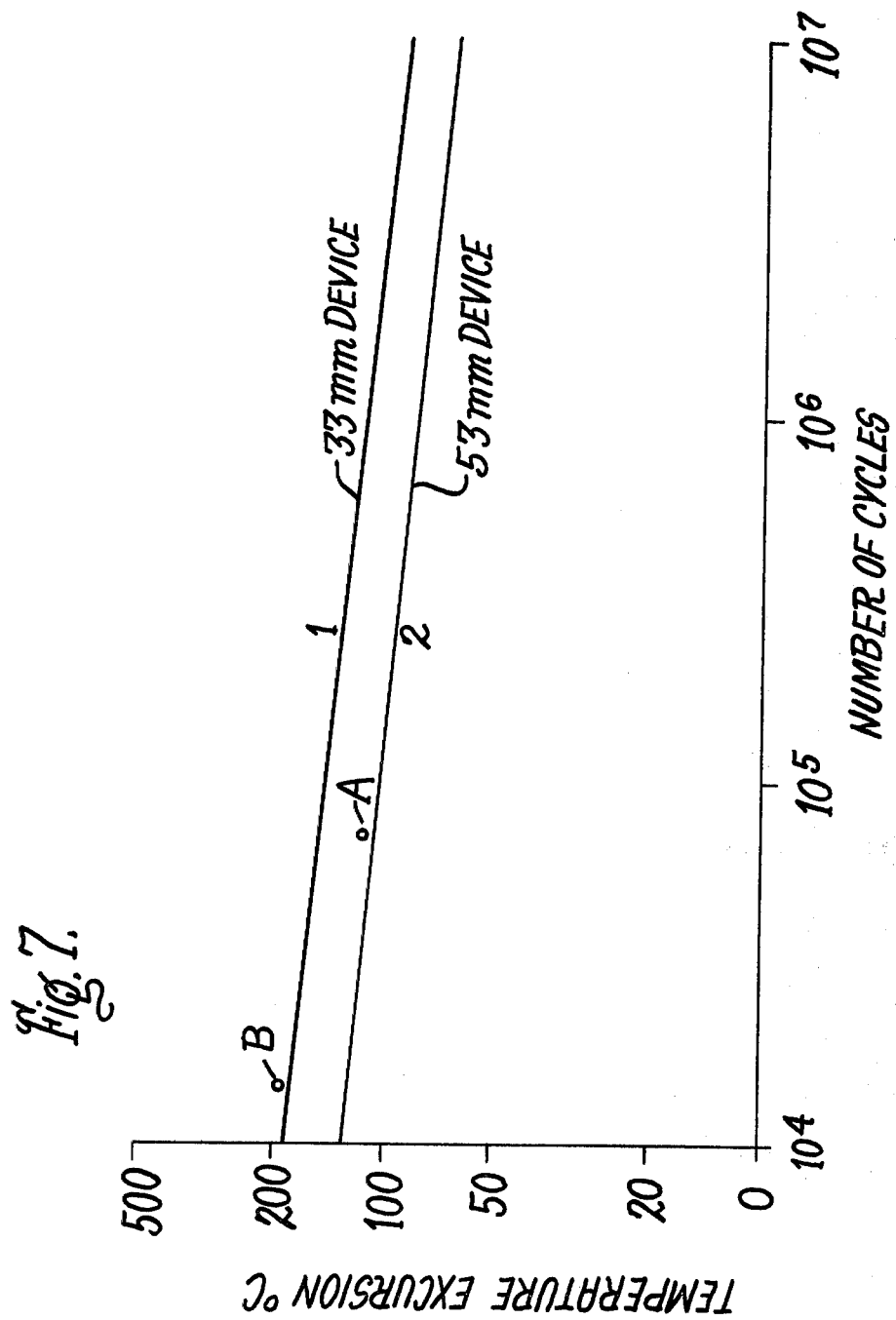

4,290,080

METHOD OF MAKING A STRAIN BUFFER FOR A SEMICONDUCTOR DEVICE

BACKGROUND OF THE INVENTION

The present invention relates to a strain buffer, and more particularly to a structured copper strain buffer for use in combination with a semiconductor device. The present invention relates also to a method of making such a structured copper strain buffer.

In the assembly of semiconductor devices, it is frequently necessary to join materials having widely different physical characteristics. For example, in attaching a metal electrode to a semiconductor diode, it is often necessary to join a body of semiconductor material, such as silicon, to a metal, such as copper or aluminum. However, the ratio of the thermal coefficient of expansion between the metal and the semiconductor is generally quite large (on the order of 6 to 1) so that severe stresses will result when appreciable areas of these materials are joined together and subjected to heat cycling developed during device operation. The resulting strains may crack the semiconductor material or destroy some of its desirable electrical properties.

In the case of high power semiconductor devices where the semiconductor bodies may be in the form of disc shaped wafers having diameters in the order of ¼" or more, large contact areas are necessarily involved. The conflicting demands of small contact area for reducing stress and large contact areas for providing good thermal and electrical conduction are presently met by the more or less make-shift solution of inserting plates of rigid refractory material, such as molybdenum or tungsten, next to the semiconductor material. The refractory metal has a thermal expansion which closely matches the thermal expansion of the semiconductor material which occurs during device operation.

However, while molybdenum, tungsten and other refractory metals have coefficients of thermal expansion close to that of typical semiconductor material, such refractory materials have relatively poor thermal and electrical conductivity characteristics with respect to common electrical materials such as copper. As a result, a device employing such a refractory metal strain buffer suffers from poor thermal and electrical conductivity problems. Further, the relatively rigid refractory metal strain buffers do not conform perfectly to the bowed cathode surface of the semiconductor device. Such bowing of the cathode surface often follows the common procedure of hard soldering the silicon wafer to a refractory metal substrate. In addition, the refractory metal strain buffer makes poor contact to the minor surface irregularities in the device cathode surface. Such minor surface irregularities are a common consequence of device processing. This imperfect mating of the rigid refractory strain buffer to the semiconductor device results in reduced thermal contact between the two parts, limiting the allowable amount of heat the device can dissipate in electrical operation, and thus, reducing the maximum allowable current at which the device may operate.

Structured copper strain buffers have been proposed for use in place of the rigid refractory metal strain buffer. A structured copper strain buffer includes a plurality of substantially straight strands of copper parallel to each other and closely packed together. The strands are of approximately the same length and diameter and generally form disc shaped structures ranging from about 0.1 centimeter to 1 centimeter in thickness with diameters ranging from 2 cm to 10 cm. A significant advantage of such a structured copper strain buffer is that, as compared to the rigid refractory metal strain buffer, the structured copper strain buffer provides a better electrical and thermal match to the semiconductor body. Exemplary structured copper strain buffers are disclosed in U.S. Pat. No. 3,295,089, entitled "Semiconductor Device," issued Dec. 27, 1966, to Moore; and U.S. Pat. No. 3,128,419, entitled "Semiconductor Device with a Thermal Stress Equalizing Plate," issued Apr. 7, 1964, to Waldkotter et al.

Although such structured copper strain buffers provide significant advantages over the refractory metal strain buffer, there are processing and other difficulties which have prevented such structured copper strain buffers from being widely employed. One technique for fabricating such a structured copper strain buffer includes employing a ring to closely pack together a plurality of copper strands and then soldering the end surfaces of the copper strands to the appropriate portions of the semiconductor device assembly. Structured copper strain buffers fabricated through such a process are subject to likely breakup or loss of individual strands until the strain buffer is soldered in place in the semiconductor device assembly. In such a process, this soldering in place provides structural integrity to the strain buffer. Accordingly, such a strain buffer can not be conveniently manipulated, e.g., handled, cut, machined, formed, etc. until such soldering is completed. Another difficulty with structured copper strain buffers resulting from such a process is that the use of solder generally degrades the thermal and electrical conductivity characteristics of the structured copper. Also, the stress relieving properties of the structured copper strain buffer are impaired if solder flows into any of the spaces between the closely packed copper strands.

Accordingly, it is a general object of our invention to provide a method for making a structured copper strain buffer in which the resultant strain buffer can be manipulated with substantially no breakup thereof and with substantially no loss of individual ones of the copper strands.

It is another object of our invention to provide such a method in which the resultant copper strain buffer, when employed in combination with a semiconductor device, makes good electrical and thermal contact to minor surface irregularities in the semiconductor body.

It is yet another object of our invention to provide a method for making a structured copper strain buffer in which the resultant structured copper strain buffer, when employed in combination with a semiconductor device, can be operable through pressure contact only or can be operable through a bonding contact.

It is yet another object of our invention to provide a structured copper strain buffer exhibiting structural integrity suitable for use in combination with a semiconductor device.

SUMMARY

In carrying out one form of our invention, we provide a method of making a thermally and electrically conductive strain buffer for a semiconductor device wherein the strain buffer includes a plurality of individual copper strands. The method includes the step of providing a plurality of substantially straight strands of copper with the strands aligned such that their lengths are substantially parallel. Each of the strands is of substantially the same length with the respective ends of each of the strands defining a pair of opposing surfaces. The strands are closely packed together to remove substantially all interstitial voids between the strands. The ends of the strands are cleaned. Then, a layer of highly electrically and thermally conductive metal having a melting point greater than 350° C. is deposited by vacuum deposition on at least one of the opposing surfaces defined by the respective ends of the strands wherein the deposited metal layer provides sufficient structural integrity to hold the strands together so that the resulting strain buffer can be manipulated with substantially no break-up thereof and with substantially no loss of individual ones of the strands.

BRIEF DESCRIPTION OF THE DRAWINGS

Our invention will be more fully understood and its various objects and advantages further appreciated by referring now to the following detailed specification, taken in conjunction with the accompanying drawing, wherein:

FIG. 6 is a side elevational view, partially in section, of a high power semiconductor rectifier assembly which includes one form of structured copper strain buffer of the present invention.

FIG. 7 is a plot showing thermal fatigue in cycles as a function of semiconductor device junction temperature excursion. The plot includes two curves representative of expected device fatigue for semiconductor assemblies employing refractory metal strain buffers.

DETAILED DESCRIPTION OF THE INVENTION

Figure 1:
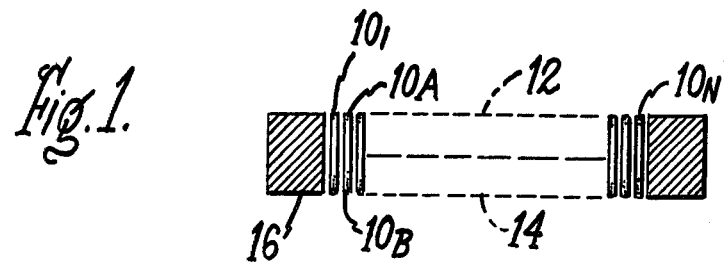
FIG. 1 is a partially sectioned side view of a structured copper disc encircled by a retaining ring.
Figure 2:
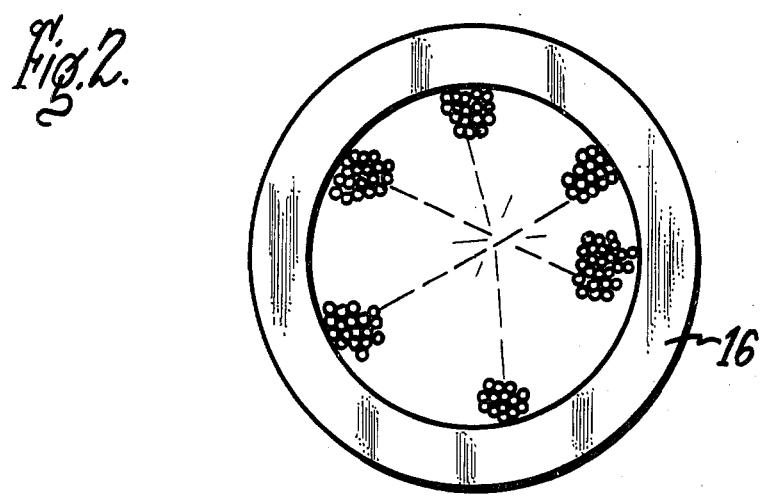
FIG. 2 is a plan view of the structured copper disc of FIG. 1.

Referring initially to FIGS. 1, 2, in carrying out one form of the method of the present invention, we provide a plurality of strands of copper wire, designated $10_1 \ldots 10_N$, or collectively designated 10. It is preferable that the copper strands include their natural oxide coating thereon. If clean, i.e., non-oxidized, strands of copper are employed, the strands tend to stick together, limiting the stress relieving capability of the resultant structured copper strain buffer. Typically, each copper wire strand has a diameter of about 10 mils (250 microns) and a length of about 0.1" (0.25 centimeters). The strands $10_1 \ldots 10_N$, are aligned such that their lengths are substantially parallel and the respective ends 10A, 10B of the strands generally define a pair of opposing flat surfaces 12, 14, shown in dashed lines in FIG. 1. A temporary retaining ring 16 of a material, such as copper is provided around the strands $10_1 \ldots 10_N$ to urge the strands 10 closely together along their lengths. This closely packs the strands 10 together to a density of about 90% of that of a solid copper disc so that substantially all interstitial voids between individual strands $10_1 \ldots 10_N$ are removed. We have found it preferable to avoid urging the strands together to the point at which the initially circular wire contour is deformed toward a hexogonal cross-section.

The opposing surfaces 12, 14 defined by the end surfaces 10A, 10B are preferably cleaned in preparation for the next step. The purpose of the cleaning step is to promote adhesion for subsequent processing. The cleaning step may comprise chemically cleaning the surfaces 12, 14 with a cleaning solution, such as 5% HCl in methanol, followed by a methanol rinse. The cleaned and rinsed surfaces 12, 14 may be dried in air or blow dried in an inert atmosphere, e.g., dry nitrogen.

Figure 3:
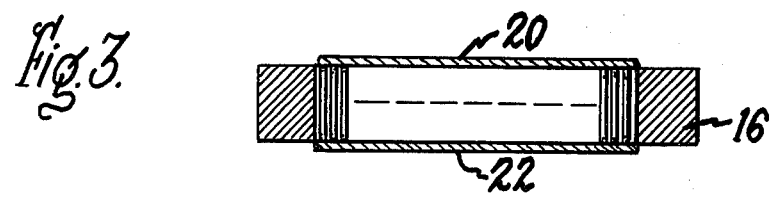
FIG. 3 is a side sectional view, taken as in FIG. 1, after metal layers are deposited on the end surfaces of the copper strands.

Referring now to FIG. 3, two layers 20, 22, of metal such as aluminum, are respectively deposited on the now-cleaned surfaces 12, 14. Suitable metals include highly electrically and thermally conductive metals such as aluminum, copper, nickel, gold, palladium, chromium, molydbendum, tungsten, platinum and silver. An important characteristic of a suitable metal for the layers 20, 22 is that its melting point should be significantly greater than that of solder. For example, solder typically has a melting point in the range of about 200° C.-320° C. Accordingly, suitable metals are those highly electrically and thermally conductive metals having a melting point greater than 350° C. The thickness of each of the metal layers 20, 22 is typically from about 2 to about 75 microns, with from about 10 to about 15 microns being preferable. In this connection, it is to be appreciated that it was quite unexpected that such a 10 to 15 micron layer would be successful. More particularly, it was unexpected that such a 10 to 15 micron layer would have sufficient mechanical strength.

The deposition step may include conventional vacuum techniques, such as vapor deposition of the metal. These vacuum techniques typically include deposition in a vacuum of less than about $10^{-2}$ mm of mercury. For example, conventional electron beam evaporation techniques may be employed with a vacuum of about $10^{-6}$ mm of mercury. After such a vapor deposition, we have found it preferable to sinter the now-deposited metal, e.g., aluminum, to the ends of the copper strands. Such a sintering step may be carried out at a temperature of about 500° C. in an atmosphere of air or in an inert atmosphere, such as nitrogen.

Vacuum deposition techniques other than vapor deposition may be employed to deposit layers 20, 22. For example, the metal layers 20, 22 may be sputter deposited on the ends of the copper strands 10. An advantage of such a sputter deposition technique is that a single sputtering system may be employed to: (1) sputter etch the end surfaces of the copper strands and thus clean such end surfaces; and also to (2) sputter deposit the metal layers 20, 22. The performance of the cleaning and depositing steps in a single sputtering system encourages maximum cleanliness. Alternatively, such a sputter deposition step may be employed with a chemical cleaning step, if desired.

Figure 4:
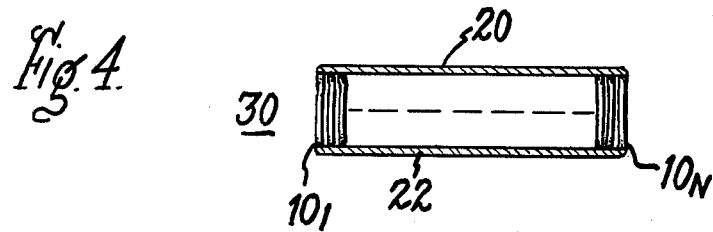
FIG. 4 is a side sectional view, taken as in FIG. 1, of a structured copper disc-strain buffer made by the method of the present invention.
Figure 5:
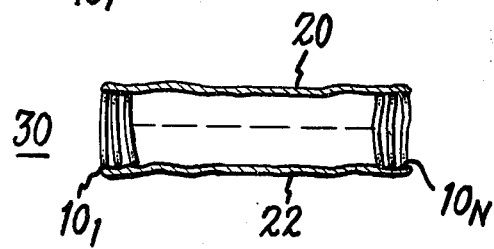
FIG. 5 is a side sectional view, taken as in FIG. 4, showing schematically the operation of the structured copper strain buffer.

The retaining ring 16 can now be removed and the resultant product, generally designated 30 in FIG. 4, comprises a structured copper disc with both end surfaces coated with deposited metal. We have found that this structured copper disc 30 can be handled and cut, machined, or otherwise formed, with substantially no loss of individual wires or break-up of the disc. Thus, the disc 30 of FIG. 4 may itself comprise the desired structured copper strain buffer for a particular application, or, the disc 30 may be machined or otherwise formed into the particular strain buffer configuration required. The structured copper disc-strain buffer 30 of FIG. 4 is flexible with the individual strands $10_1 \ldots 10_N$ having the capability to move slightly under pressure to ensure conformity of the metal layers 20 or 22 to an irregular device surface against which it is disposed. The operation of such a structured copper disc-strain buffer 30 is schematically shown in FIG. 5. Accordingly, such a disc-strain buffer 30, when used in place of a refractory metal substrate in a semiconductor device assembly, provides more intimate contact with the appropriate device surface while the flexibility of the individual wires prevents severe strains from developing during thermal expansion and contraction of the device.

Our invention may be further appreciated through reference to the following EXAMPLE. It being understood however, that our invention is not limited to the specific details recited therein.

EXAMPLE

A plurality of copper wires were contained in a temporary retaining ring as in FIGS. 1 & 2. Each copper wire had a diameter of about 250 microns and a length of 2.5 mm. The packing density was about 90% that of solid copper.

The end surfaces of the packed wires were cleaned by swabbing with a solution of 5% HCl in methanol, then swabbing immediately thereafter with methanol, and followed by swabbing with dry cotton.

The now-cleaned disc was then conventionally electron beam plated with aluminum on both sides to a thickness of about 12 microns.

A 2" diameter disc was punched out of the now-coated disc. The coated disc was then sintered at 500° C. in vacuum for one hour. Before sintering, the electron beam plated aluminum was not adhering well to the ends of the copper wires. However, after the sintering step, the aluminum adhered to the copper very well.

A final disc of the same diameter as the rigid refractory metal strain buffer presently employed in a commercially available 53 mm semiconductor diode assembly was then punched out. This 53 mm diode assembly is commercially available from General Electric Company under the designation A780 and is generally designated 40 in FIG. 6.

Referring now more particularly to the diode assembly 40 of FIG. 6 representative of the previously mentioned 53 mm diode assembly, the semiconductor diode 42 includes wafer 42a of silicon joined to a substrate 42b of molybdenum or tungsten with diode 42 being sandwiched between two spaced-apart conductive posts 44, 45. The posts 44, 45 have flat facing surfaces 46, 47 which are parallel to each other. Between the lower surface 46 of the upper post 44 and the diode 42, there is a strain buffer 30 which heretofore has comprised a rigid refractory metal disc of tungsten or molybdenum. One surface of the strain buffer 30 contacts the post surface 46 and the other surface contacts the upper surface of semiconductor diode 42. A protective coating 48 of insulation, e.g., silicone rubber, covers the outer periphery of the silicon wafer 42a. A housing 50 includes a hollow cylindrical insulator 52, preferably of ceramic material. The housing 50 includes sealing means 54, 56 at opposing ends of the cylinder 52 for forming seals between the posts 44, 45 and the ends of the insulating cylinder 52. The sealing means 54 comprises mating metal flanges 54a, 54b. The sealing means 56 comprises a metal ring 56a. Centering of the semiconductor diode 42 in the housing is simplified by providing rubber tire 58. Further information on one form of such a diode assembly may be found in U.S. Pat. No. 4,099,201, issued to Mueller on July 4, 1978.

The final copper disc described earlier in this EXAMPLE was then employed in place of the conventional refractory metal strain buffer in the 53 mm semiconductor diode assembly (A780) previously described. This assembly, now including the structured copper strain buffer, was then tested. The diode assembly in which the structured copper strain buffer was tested is substantially the same as the semiconductor diode assembly (A780) shown in FIG. 6 of the present application although the diode assembly employing the structured copper strain buffer was not sealed as the thickness of the structured copper strain buffer was somewhat greater than the thickness of the refractory metal buffer it replaced.

Referring now to the curves of FIG. 7, the testing of diode assembly 40 of FIG. 6, now including the structured copper strain buffer 30 of this EXAMPLE will be discussed. Curve No. 1 represents the expected performance of a 33 mm semiconductor diode assembly (GE assembly A540) including a refractory metal strain buffer. Curve No. 2 represents the expected performance of a semiconductor diode assembly for the 53 mm diode assembly GE assembly (A780) employing a refractory metal strain buffer.

The 53 mm test assembly, including the structured copper strain buffer, was then subject to current cycling in order to test for thermal fatigue. In this connection, 66,000 cycles at 115° C. excursion were applied (Point A), exceeding Curve 2 representing the expected performance of the assembly. In addition, we concluded with a stress of 14,300 cycles at 185° C. excursion (Point B), exceeding the expected performance of a 33 mm assembly, curve 1. The current cycling comprised using 1500 amps average in the mode of 30 seconds on and 30 seconds off. At this point, the test was concluded with no device failure having been observed.

After the conclusion of the test, the structured disc-strain buffer of the EXAMPLE was found to be firmly attached to the semiconductor body. The outer edge of the disc was lightly stuck to the rubber gasket (58) which forms part of the device assembly. Removal of the rubber gasket from the junction assembly caused some of the outer wires of the strain buffer to be pulled off. The outer wires on the structured copper strain buffer still had a dull copper appearance while wires just a few wire diameters in from the edges of the disc had a blue-grey appearance. These blue-grey wires were analyzed and found to comprise copper oxide.

The test assembly was further examined to determine the degree of wear at contact surfaces. In this connection, it was observed tht the structured copper strain buffer 30—post surface 46 interface showed substantially less wear than normally observed in the conventional refractory metal strain buffer design, when subjected to similar stress levels. Indeed, the refractory substrate 42b—post surface 47 showed the heavy wear expected under these stress levels.

In connection with the structured copper strain buffer in combination with a semiconductor device assembly, it is to be appreciated that the strain buffer can be operable simply through pressure contact or operable through a bonding contact. Also, although it is preferable to coat both sides of the strain buffer, for some applications, satisfactory results can be obtained by coating only one side.

While we have illustrated preferred embodiments of our invention by way of illustration, many modifications will occur to those skilled in the art, and we therefore wish to have it understood that we intend in the appended claims to cover all such modifications as fall within the true spirit and scope of our invention.

What we claim as new and desire to secure by Letters Patent of the United States is:

1. A method of making a thermally and electrically conductive strain buffer for a semiconductor device, the strain buffer including a plurality of individual copper strands, comprising the steps of:
   a. providing a plurality of substantially straight strands of copper, said strands being aligned such that their lengths are substantially parallel, each of said strands being of substantially the same length, the respective ends of each of said strands defining a pair of opposing surfaces;
   b. closely packing said strands together to remove substantially all interstitial voids between said strands;
   c. cleaning said ends of said strands, and then,
   d. depositing by vacuum deposition a layer of highly electrically and thermally conductive metal having a melting point greater than 350° C. on at least one of said opposing surfaces defined by said respective ends of said strands, wherein said deposited metal layer provides sufficient structural integrity to hold said strands together so that the resulting strain buffer can be manipulated with substantially no break-up thereof and with substantially no loss of individual ones of said strands.

2. A method in accordance with claim 1 in which the step of depositing comprises depositing said metal layer on each of said opposing surfaces defined by said respective end of said strands.

3. A method in accordance with claim 2 in which said metal layer comprises a metal chosen from the group consisting of aluminum, copper, nickel, gold, palladium, chromium, tungsten, platinum, silver molybdenum, and in which the step of depositing comprises depositing said layer to a thickness of from about 2 to about 75 microns.

4. A method in accordance with claim 3 in which said metal comprises aluminum and the step of depositing comprises depositing each of said layers to a thickness of from about 10 to about 15 microns.

5. A method in accordance with claim 4 in which the step of depositing comprises depositing in a vacuum of at least $10^{-2}$ mm of mercury.

6. A method in accordance with claim 5 in which the step of depositing comprises electron beam evaporation.

7. A method in accordance with claim 6 in which the step of depositing comprises depositing in a vacuum of about $10^{-6}$ mm of mercury.

8. A method in accordance with claim 3 which includes the further step of sintering said deposited layers.

9. A method in accordance with claim 8 in which the step of sintering comprises heating said deposited layers to a temperature of about 500° C.

10. A method in accordance with claim 8 in which the step of cleaning comprises chemical cleaning.

11. A method in accordance with claim 8 in which the step of cleaning comprises sputter etching.

12. A method in accordance with claim 3 in which the step of cleaning comprises sputter etching and the step of depositing comprises sputter depositing.

13. A method in accordance with claim 3 in which the step of depositing comprises depositing said layers to a thickness of from about 10 to about 15 microns.

14. A method in accordance with claim 13 in which the step of depositing comprises depositing in a vacuum of at least $10^{-2}$ mm of mercury.

15. A method in accordance with claim 2 in which said metal has a melting point of at least 350° C.

16. A structured copper strain buffer made by the method of claim 1, claim 3 or claim 12.

17. A semiconductor assembly comprising a silicon wafer, a conductive post having a flat surface facing said wafer, and a strain buffer made by the method of claim 1 sandwiched between said flat surface of the post and said wafer, the deposited layer of said strain buffer facing said wafer.

18. A semiconductor assembly comprising a silicon wafer, a conductive post having a flat surface facing said wafer, and a strain buffer made by the method of claim 3 sandwiched between said flat surface of the post and said wafer, the deposited layer on one side of said strain buffer facing said wafer.

19. A semiconductor assembly comprising a silicon wafer, a conductive post having a flat surface facing said wafer, and a strain buffer made by the method of claim 12 sandwiched between said flat surface of the post and said wafer, the deposited layer on one side of said strain buffer facing said wafer.

20. A method of making a strain buffer for use in combination with a semiconductor device assembly, comprising the steps of:
   a. providing a plurality of substantially straight strands of copper wire, said strands being aligned such that their lengths are substantially parallel, each of said strands being of substantially the same length, the respective ends of each of said strands defining a pair of flat opposing surfaces;
   b. packing said strands together to a density of about 90% of that of solid copper,
   c. cleaning said ends of said strands;
   d. vacuum depositing a layer of aluminum on each of said opposing surfaces defined by said respective ends of said strands each of said deposited metal layers being from about 2 to about 75 microns in thickness.

21. A method in accordance with claim 20 in which the step of depositing comprises depositing each of said metal layers to a thickness of from about 10 to about 15 microns and then sintering said deposited layers.

22. A method in accordance with claim 20 in which the depositing step comprises depositing in a vacuum of about $10^{-6}$ mm of mercury and the sintering step comprises heating said deposited layers to a temperature of about 500° C.

23. A method in accordance with claim 22 in which the step of cleaning comprises chemical cleaning.

24. A method in accordance with claim 23 in which the step of cleaning comprises:
   a. applying a cleaning solution of HCl in methanol to said ends of said strands, then
   b. rinsing said ends with methanol; and then
   c. drying said ends.

* * * * *